(12) United States Patent
Hiraishi et al.

(10) Patent No.: US 8,922,029 B2
(45) Date of Patent: Dec. 30, 2014

(54) APPARATUS HAVING A WIRING BOARD AND MEMORY DEVICES

(75) Inventors: Atsushi Hiraishi, Tokyo (JP); Toshio Sugano, Tokyo (JP); Masahiro Yamaguchi, Tokyo (JP); Yoji Nishio, Tokyo (JP); Tsutomu Hara, Tokyo (JP); Koichiro Aoki, Tokyo (JP)

(73) Assignee: PS4 Luxco S.A.R.L., Luxembourg (LU)

( * ) Notice: Subject to any disclaimer, the term of this patent is extended or adjusted under 35 U.S.C. 154(b) by 0 days.

(21) Appl. No.: 13/363,396

(22) Filed: Feb. 1, 2012

(65) Prior Publication Data

US 2012/0127675 A1    May 24, 2012

Related U.S. Application Data

(63) Continuation of application No. 12/239,900, filed on Sep. 29, 2008, now Pat. No. 8,134,239.

(30) Foreign Application Priority Data

Sep. 28, 2007   (JP) .................................. 2007-253470

(51) Int. Cl.
| | |
|---|---|
| H01L 23/48 | (2006.01) |
| H01L 23/52 | (2006.01) |
| H01L 29/40 | (2006.01) |
| G11C 5/06 | (2006.01) |
| G11C 5/04 | (2006.01) |
| G11C 8/14 | (2006.01) |
| H05K 1/18 | (2006.01) |

(52) U.S. Cl.
CPC ....... *G11C 5/063* (2013.01); *G11C 5/04* (2013.01); *G11C 8/14* (2013.01); *H05K 1/181* (2013.01); *H05K 2201/09254* (2013.01); *H05K 2201/09263* (2013.01); *H05K 2201/10159* (2013.01)
USPC .......................................... 257/784; 361/748

(58) Field of Classification Search
USPC ........................................................ 257/784
See application file for complete search history.

(56) References Cited

U.S. PATENT DOCUMENTS

| | | | |
|---|---|---|---|
| 5,394,121 A | 2/1995 | Cipolla et al. | |
| 6,125,419 A | 9/2000 | Umemura et al. | |
| 6,927,992 B1 | 8/2005 | Yen | |
| 6,978,328 B1 | 12/2005 | Osaka et al. | |

(Continued)

FOREIGN PATENT DOCUMENTS

| | | |
|---|---|---|
| JP | 7-250104 | 9/1995 |
| JP | 2004-62530 | 2/2004 |

*Primary Examiner* — Matthew Landau
*Assistant Examiner* — Igwe U Anya
(74) *Attorney, Agent, or Firm* — Young & Thompson (57) ABSTRACT

An address signal line having a stub structure connects between at least three memory elements and a data transferring element and transmits address signals for the memory elements. An address terminal of the data transferring element has an impedance lower than a characteristic impedance of the address signal line. A wiring length TL0 from the data transferring element to a first branch point S1 where a branch line is branched at a shortest distance from the data transferring element is configured to become equal to or greater than a wiring length TL1 from the first branch point S1 to a second branch point S2 where a second branch line is branched. A wiring length TL3 from the second branch point S2 to a third branch point S3 where a third branch line is branched is configured to become greater than the wiring lengths TL0 and TL1.

16 Claims, 13 Drawing Sheets

MEMORY ADDRESS LINE TOPOLOGY (56) References Cited

U.S. PATENT DOCUMENTS

| | | | |
|---|---|---|---|
| 7,389,381 B1* | 6/2008 | Co | 711/115 |
| 7,697,332 B2* | 4/2010 | Qu et al. | 365/185.09 |
| 7,904,655 B2* | 3/2011 | Co | 711/115 |
| 8,134,239 B2* | 3/2012 | Hiraishi et al. | 257/784 |
| 2001/0045874 A1* | 11/2001 | Lee | 333/33 |
| 2003/0037216 A1 | 2/2003 | Shibata et al. | |
| 2004/0251929 A1 | 12/2004 | Pax et al. | |
| 2005/0052912 A1 | 3/2005 | Cogdill et al. | |
| 2005/0086418 A1 | 4/2005 | Cogdill et al. | |
| 2005/0142950 A1* | 6/2005 | Haba et al. | 439/631 |
| 2006/0236031 A1* | 10/2006 | Perego et al. | 711/115 |
| 2007/0194968 A1 | 8/2007 | Sung et al. | |

\* cited by examiner

FIG. 1A

MEMORY ADDRESS LINE TOPOLOGY

FIG. 1B

WIRING LENGTHS IN FIRST EMBODIMENT

|        | TL0  | TL1  | TL2 | TL3_1 | TL3_2 | TL4  | TL5  | TL6 | Unit |
|--------|------|------|-----|-------|-------|------|------|-----|------|
| Length | 11.6 | 11.0 | 3.0 | 30.0  | 15.0  | 16.0 | 15.0 | 0.6 | [mm] |

FIG. 1C

WIRING LENGTHS IN RELATED ART EXAMPLE

|        | TL0  | TL1  | TL2 | TL3_1 | TL3_2 | TL4  | TL5  | TL6 | Unit |
|--------|------|------|-----|-------|-------|------|------|-----|------|
| Length | 11.6 | 11.0 | 3.0 | 15.0  | 15.0  | 16.0 | 15.0 | 0.6 | [mm] |

FIG. 2A

TOP VIEW

FIG. 2B

SIDE VIEW

FIG. 3

ADDRESS SIGNAL WAVEFORM IN RELATED ART CONFIGURATION

ΔV [V]
(Vref: POTENTIAL DIFFERENCE AT POINT C)

Δtr [ps]
(RISING TIME: TIME REQUIRED TO REACH UPPER LIMIT OF NOISE MARGIN)

FIG. 4

ANALYSIS OF NOISE FACTORS (D17)

ADDRESS SIGNAL WAVEFORMS OF FIRST EMBODIMENT (D17)

FIG. 7

ADDRESS SIGNAL WAVEFORMS OF FIRST EMBODIMENT (D13)

FIG. 8

NOISE EVALUATION FOR ADDRESS SIGNAL WAVEFORMS OF FIRST EMBODIMENT (SUMMARY)

FIG. 9A

ADDRESS SIGNAL WAVEFORMS IN MEMORY
ELEMENTS OF SECOND EMBODIMENT

FIG. 9B

WIRING LENGTHS IN SECOND EMBODIMENT

|  | TL0 | TL1 | TL2 | TL3_1 | TL3_2 | TL3_3 | TL4 | TL5 | TL6 | Unit |
|---|---|---|---|---|---|---|---|---|---|---|
| Best | 12.6 | 8.0 | 3.0 | 26.0 | 15.0 | 15.0 | 16.0 | 15.0 | 0.6 | [mm] |

FIG. 10A

MEMORY PACKAGE STRUCTURE AND WIRING
CONFIGURATION ACCORDING TO THIRD EMBODIMENT

STACKED PACKAGE STRUCTURE

FIG. 10B

STACKED PACKAGE WIRING CONFIGURATION IN RELATED ART

FIG. 10C

WIRING CONFIGURATION TO EQUALIZE WIRING LENGTHS
IN PACKAGE ACCORDING TO THIRD EMBODIMENT

FIG. 11

ADDRESS SIGNAL WAVEFORMS OF THIRD EMBODIMENT (D17)

(a) RELATED ART STACKED PACKAGE STRUCTURE (D17)

(b) PACKAGE STRUCTURE WITH EQUALIZED WIRING LENGTHS ACCORDING TO THIRD EMBODIMENT (D17)

FIG. 12A

ADDRESS SIGNAL WAVEFORMS IN MEMORY
ELEMENTS OF THIRD EMBODIMENT

FIG. 12B

|      | TL0  | TL1 | TL2 | TL3_1 | TL3_2 | TL3_3 | TL4  | TL5  | TL6 | Unit |
|------|------|-----|-----|-------|-------|-------|------|------|-----|------|
| Best | 12.6 | 8.0 | 3.0 | 26.0  | 15.0  | 15.0  | 16.0 | 15.0 | 0.6 | [mm] |

FIG. 13

CONFIGURATION EXAMPLE OF SERVER
WITH MEMORY BOARD OF THE INVENTION

FIG. 14

BLOCK DIAGRAM OF EXAMPLE OF ARCHITECTURE
AROUND MEMORY OF THE INVENTION

APPARATUS HAVING A WIRING BOARD AND MEMORY DEVICES

CROSS REFERENCE TO RELATED APPLICATIONS

This application is a continuation of co-pending application Ser. No. 12/239,900 filed Sep. 29, 2008, which claims foreign priority to Japanese patent application 2007-253470 filed on Sep. 28, 2007. The entire content of each of these applications is hereby expressly incorporated by reference.

FIELD OF THE INVENTION

The present invention relates to a printed wiring board having semiconductor elements mounted thereon, and in particular to an address line wiring structure in a memory board having a memory mounted thereon.

DESCRIPTION OF RELATED ART

It is imperative for improved performance of information processing devices to enhance the speed and capacity of memory mounting boards. A stub structure is employed for memory signal wiring in which branch lines are branched at branch points on a main line.

Employing such a stub structure having branch points, however, lines are connected in parallel at the branch points, resulting in low characteristic impedance. This will produce negative reflection in transmitted waves, causing waveform distortion or blunting in a rising waveform. Further, when there are a plurality of branch points, reflected waves mutually interfere in a complicated manner at the branch points, inducing an oscillating jitter in a signal waveform. Such jitter, waveform distortion, or rising waveform blunting may cause failure in reading signals or failure in synchronizing the reading timing, leading to an error in signal reading.

In high-speed memories, an SSTL (Stub Series Terminated Logic) method is employed for data signals to minimize reflected waves at branch points, in which a resistance element having an impedance value corresponding to a half of a characteristic impedance of a signal line is inserted on the branch line side of each branch point (see, for example, Patent Documents 1 and 2 and Non-Patent Document 1).

Patent Document 1: Japanese Laid-Open Patent Publication Nos. H07-250104
Patent Document 2: Japanese Laid-Open Patent Publication Nos. 2004-62530
Non-Patent Document 1: Elpida Memory User Manual, "How to Use DDR-SDRAM (Double Data Rate Synchronous Dynamic Random Access Memory)", Chapter 1, p. 14, 1.1.4 Interface, (4) Interface Specifications Patent Document 2, for example, discloses a memory module comprising a memory chip, a pin for connecting the memory chip to a connector on a mother board, a bus for connecting between the memory chip and the pin, and a terminating resistor connected to an end of the bus. In this memory module, a stub resistor is inserted and connected between the pin and the other end of the bus.

In the above memory module, address signals are transferred through a branch line having no inserted resistor since the address signals have a transmission speed of a half the transmission speed of data signals. However, when the signal transmission speed is increased, the signal speed along the address line is also increased. In this case, the present inventors have recognized that waveform distortion, rising waveform blunting, or a jitter will possibly make it impossible to transmit address signals properly.

SUMMARY

The present invention seeks to solve the above problem.

In one embodiment, there is provided an address line wiring structure comprising an address signal line that connects between at least three memory elements and a data transferring element for transferring data among the at least three memory elements and that transmits address signals for the memory elements. The address signal line has a stub structure including branch lines branched from a main line to the respective memory elements. According to an aspect, an address terminal of the data transferring element has an output impedance lower than a characteristic impedance of the address signal line. A wiring length TL0 from the data transferring element to a first branch point S1 where a branch line is branched at a shortest distance from the data transferring element is configured to become substantially equal to or greater than a wiring length TL1 from the first branch point S1 to a second branch point S2 where a second branch line is branched. A wiring length TL3 from the second branch point S2 to a third branch point S3 where a third branch line is branched is configured to become greater than the wiring lengths TL0 and TL1.

According to the address line wiring structure as described above, negative reflected waves generated at the second branch point S2 and positive reflected waves that are obtained by the data transferring element reflecting negative reflected waves generated at the first branch point S1 are canceled with each other. Further, the negative reflected waves reflected at the third branch point S3 reach the memory element on the second branch line at a time after a threshold voltage used for distinguishing the "0" level and the "1" level has been exceeded, whereby waveform distortion and delay can be prevented in the vicinity thereof.

In another embodiment, there is provided a wiring structure comprising a buffer circuit that generates a signal and a bus line including a first part connected between the buffer circuit and a first node, a second part connected between the first node and a second node, and a third part connected between the second node and a third node. In this case, the second part is substantially equal to or smaller in length than the first part, the third part is larger in length than the first part or the second part, and each of the first, second, and third nodes are connected with corresponding memory device of a plurality of memory devices.

BRIEF DESCRIPTION OF THE DRAWINGS

The above features and advantages of the present invention will be more apparent from the following description of certain preferred embodiments taken in conjunction with the accompanying drawings, in which:

FIG. 12A shows address signal waveforms of memory elements while

DESCRIPTION OF THE PREFERRED EMBODIMENTS

The invention will be now described herein with reference to illustrative embodiments. Those skilled in the art will recognize that many alternative embodiments can be accomplished using the teachings of the present invention and that the invention is not limited to the embodiments illustrated for explanatory purposes.

First Embodiment

A first embodiment of the present invention will be described with reference to FIGS. 1 to 10.

Figure 2A:
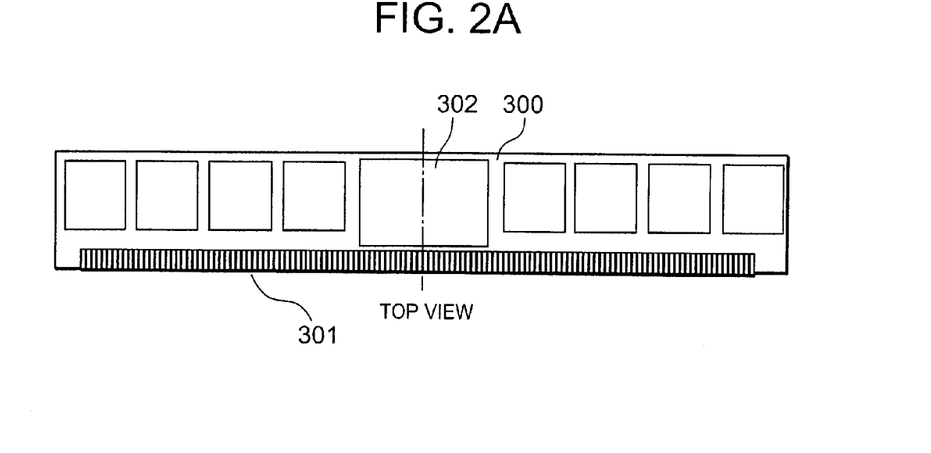
FIGS. 2A and 2B are diagrams for explaining a schematic configuration of a memory board to which the present invention is applied, FIG. 2A being a top view and FIG. 2B being a side view of the memory board.
Figure 2B:
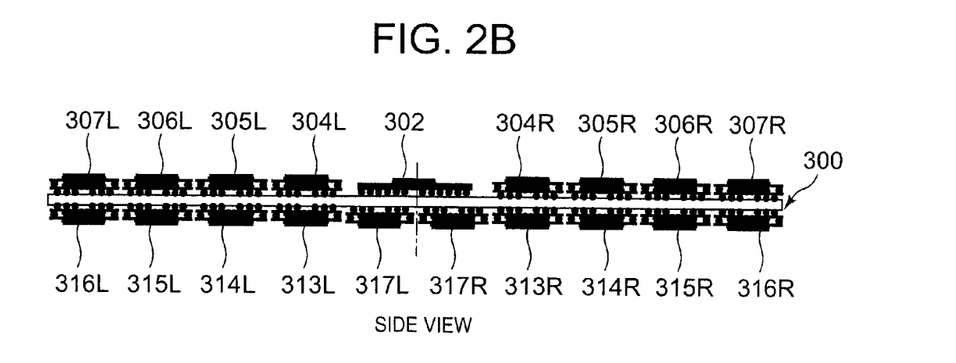

The first embodiment is an example in which the present invention is applied to a buffered DIMM (Dual Inline Memory Module) comprising buffer elements (buffer circuits) mounted on a memory board as shown in FIGS. 2A and 2B. As shown in FIG. 2A, a DIMM board (memory board) 300 is electrically connected to a CPU board (not shown) through a connector terminal 301, so that address signals and data signals for memory elements are transferred between a buffer element (data transfer element) 302 and a memory controller on the CPU board. As shown in FIG. 2B, the buffer element 302 transmits address and data signals to eighteen memory elements 304R, 305R, 306R, 307R, 313R, 314R, 315R, 316R, 317R, 304L, 305L, 306L, 307L, 313L, 314L, 315L, 316L and 317L. Each of the memory elements has a two-layer stacked structure in which two memory chips are mounted while being stacked on each other.

Figure 1A:
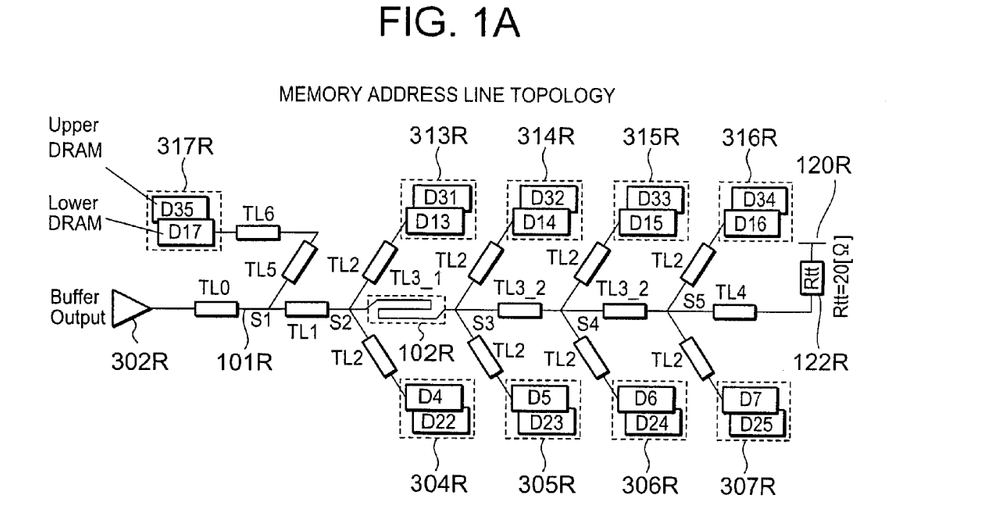
FIGS. 1A to 1C are diagrams for explaining an address line topology of a memory module according to a first embodiment of the present invention in association with wiring lengths while comparing with a related art example, FIG. 1A showing an address line topology of a memory, FIG. 1B showing wiring lengths in the first embodiment of the present invention, and FIG. 1C showing wiring lengths in a related art example.

FIG. 1A shows a topology of address signals between the buffer element 302 and the plurality of memory elements shown in FIG. 2B. In this topology, the memory elements transmitting signals are divided into two systems, i.e., a right system (indicated by a suffix of R) and a left system (indicated by a suffix of L), arranged on the opposite sides of the buffer element 302 shown in FIG. 2B. For transmission of address signals, there is a main line (bus line) 101R extending from an output circuit 302R of the buffer element. The main line 101R is branched into branch lines to the respective memory elements and is connected to a terminating end 120R at a terminating potential Vtt via a terminating resistor 122R having a resistance value of 20Ω. The memory element 317R arranged on the rear side of the buffer element 302 in FIG. 2B is connected to the main line 101R through a branch line connecting to a first branch point S1 which is closest to the buffer element 302. Two memory elements 304R and 313R are connected to a second branch point S2 of the main line 101R on the front and rear surfaces, respectively.

Likewise, two memory elements 305R and 314R are connected to a third branch point S3 of the main line 101R on the front and rear surfaces, respectively. Two memory elements 306R and 315R are connected to a fourth branch point S4 on the front and rear surfaces, respectively. Two memory elements 307R and 316R are connected to a fifth branch point S5 on the front and rear surfaces, respectively.

Figure 1B:
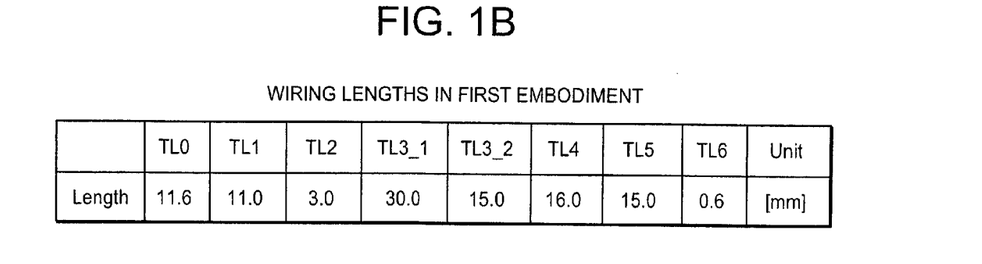

FIG. 1B shows wiring lengths (distances) of respective interconnections in the memory module according to the first embodiment. In the first embodiment, a wiring length TL0 between the buffer element 302 and the first branch point S1 is set to 11.6 mm, a wiring length TL1 between the first and the second branch points S1 and S2 is set to 11.0 mm, and a wiring length TL3_1 between the second and the third branch points S2 and S3 is set to 30 mm so as to establish relations of TL0≈TL1, TL0<TL3_1, and TL1<TL3_1. The symbol "≈" means that the wiring length TL0 is substantially equal to the wiring length TL1.

The wiring length TL3_2 between the third and the fourth branch points S3 and S4 and the wiring length TL3_2 between the fourth and the fifth branch points S4 and S5 are set to 15 mm so as to achieve the shortest interconnection.

Figure 1C:
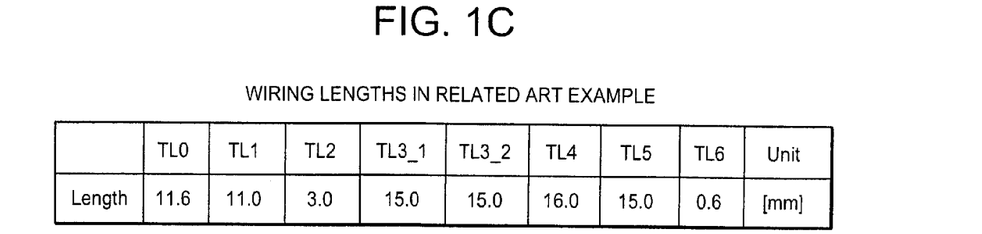
Figure 3:
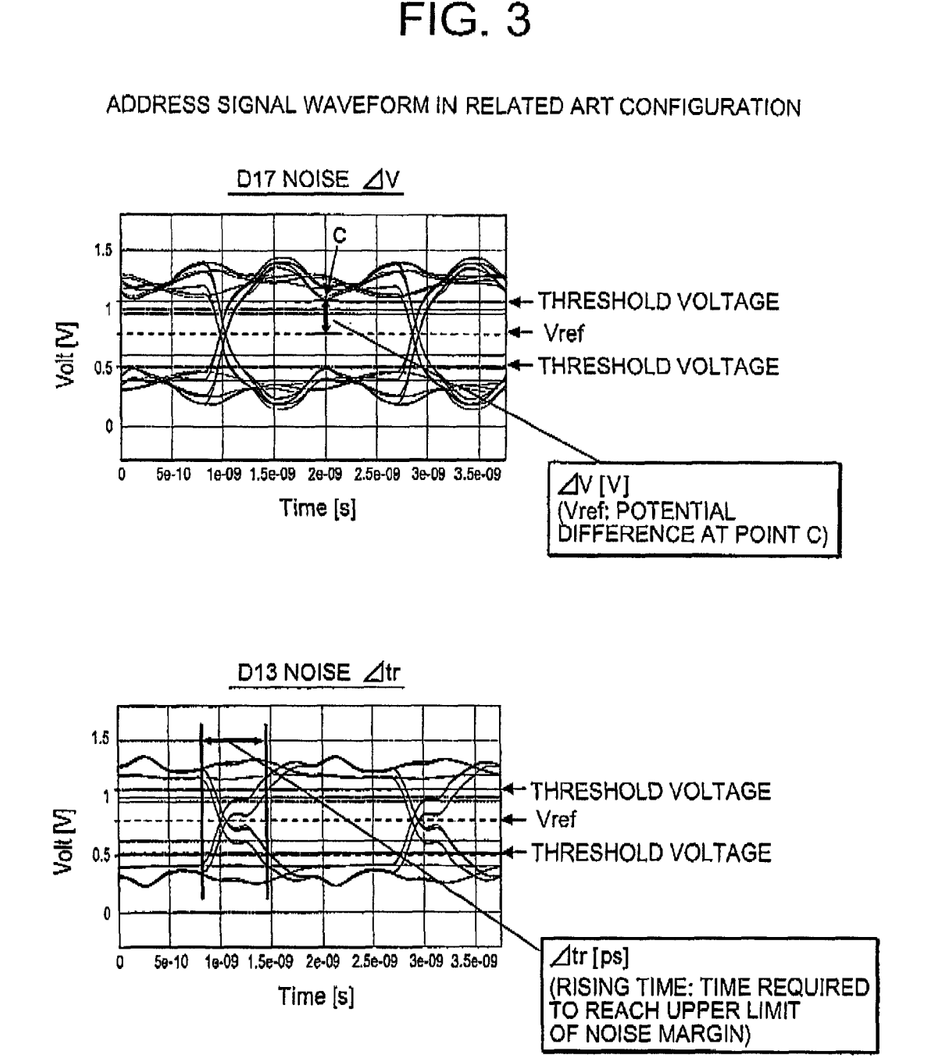
FIG. 3 shows address signal waveforms observed when employing an address line topology of a memory module in a related art.

FIG. 1C shows wiring lengths of a wiring pattern in a related art. In this case, unlike the first embodiment, a wiring length TL3_1 between the second and the third branch points S2 and S3, a wiring length TL3_2 between the third and the fourth branch points S3 and S4, and a wiring length TL3_2 between the fourth and the fifth branch points S4 and S5 are all set to 15 mm. Address signal waveforms under this condition were simulated and analyzed by using SPICE (Simulation Program for Integrated Circuit Evaluation). The analysis was conducted by transmitting a 533 MHz random signal from the buffer element 302 and signal waveforms observed at the input of each memory chip were represented in eye patterns. The results of this simulation analysis are shown in FIG. 3. As seen from FIG. 3, the signal waveform (the upper diagram of FIG. 3) in the lower chip D17 of the memory element 317R closest to the buffer element presents a constriction distortion in the middle of the eye pattern aperture. The signal waveform (the lower diagram of FIG. 3) in the lower chip D13 of the memory element 313R mounted at the second closest position to the buffer element presents a step in a rising portion, causing a substantial delay in rising time Δtr.

Figure 4:
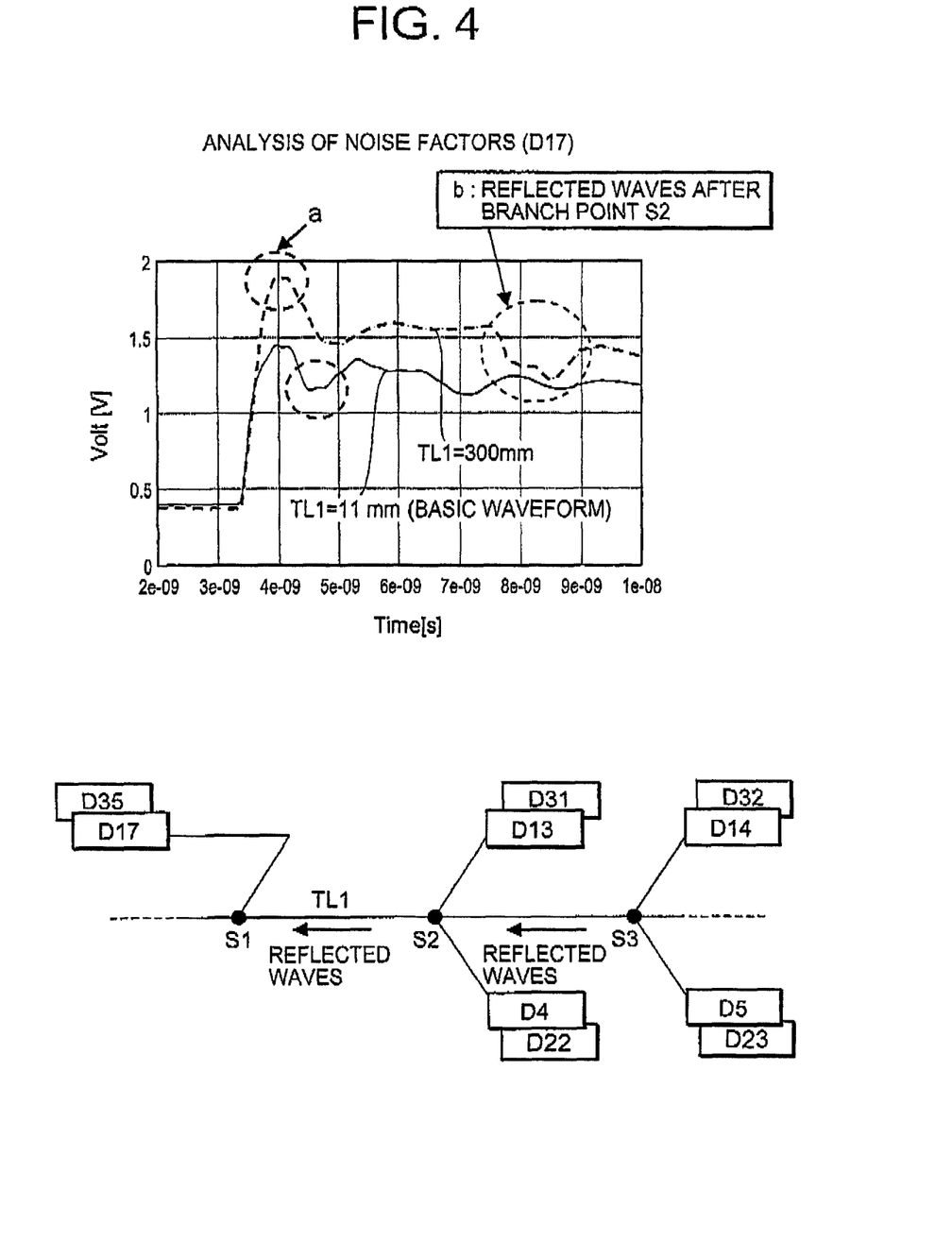
FIG. 4 is diagrams for explaining analysis of noise factors.

FIG. 4 shows results of analysis of causes of the waveform distortion in the lower chip D17. FIG. 4 shows a step pulse waveform observed when the wiring length TL1 between the first and the second branch points S1 and S2 is extremely increased from 11 mm to 300 mm. As seen from this result, the time at which the waveform distortion b due to constriction appears is delayed as the overshoot in the portion a circled by the broken line in FIG. 4 is increased. This is because the time at which negative reflection occurring after the second branch point S2 reaches the lower chip D17 is delayed, and hence the time at which the waveform distortion b due to the constriction appears is delayed. The overshoot in the portion a is increased because negative reflected waves produced at the first branch point S1 are further reflected negatively at the buffer element to become positive reflected waves appearing as an overshoot waveform. The negative reflected waves are negatively reflected at the buffer element because the output impedance of an address terminal of the buffer element is lower than the characteristic impedance of the address signal line. In a general wiring pattern, this overshoot is partially canceled with reflected waves after the second branch point S2, resulting in a waveform having a small overshoot as shown in FIG. 4. As described above, the reflected waves at the branch points after the second branch point S2 affect the constricted waveform of the lower chip D17.

Figure 5:
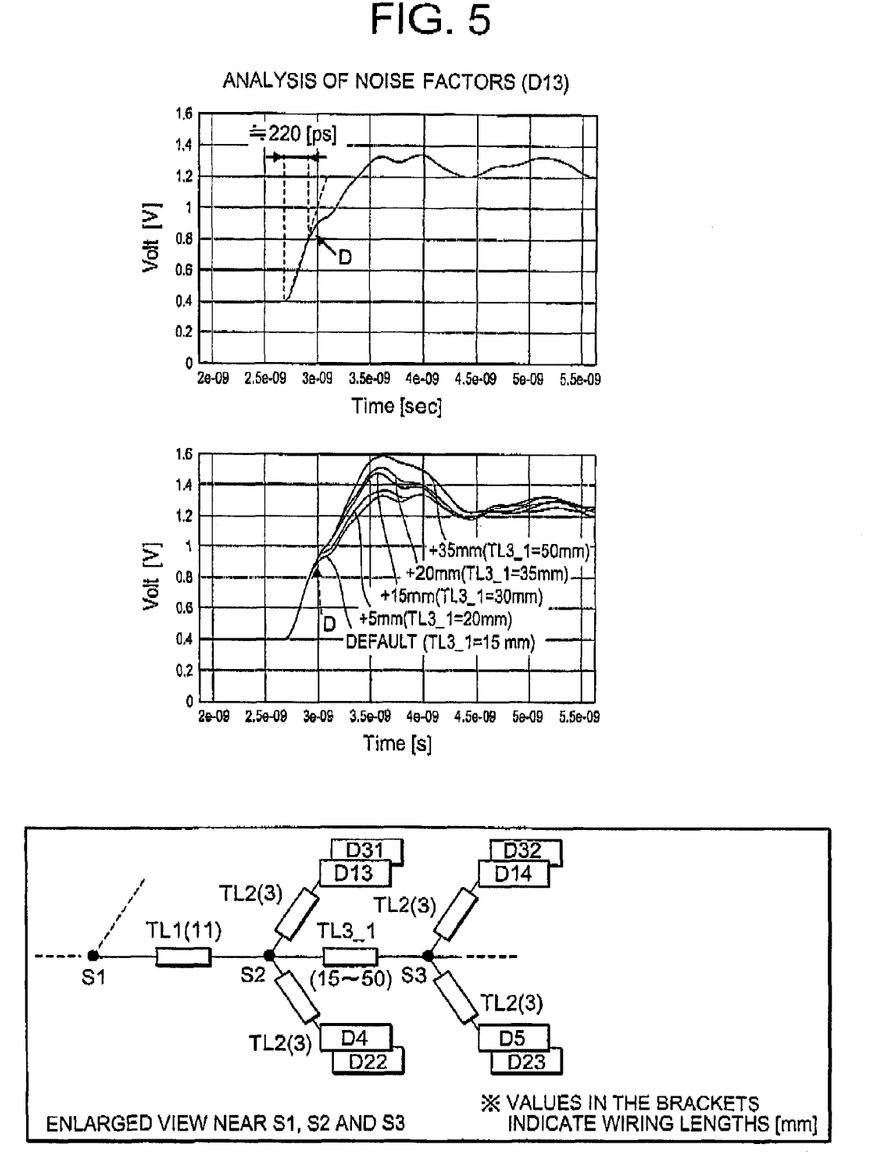
FIG. 5 is diagrams for explaining analysis of noise factors.

FIG. 5 shows results of the analysis of blunting in the rising waveform of the lower chip D13. As seen from FIG. 5, the period of time is measured to be 220 ps from the start of the rising waveform to the point D at which the waveform commences to blunt. If it is assumed that the propagation time is 7 ps/mm, the length becomes 31.4 mm, corresponding to about twice the wiring length (TL3_1) of 15 mm between the second and the third branch points S2 and S3. Therefore, simulation analysis was conducted while changing the wiring length between the second and the third branch points S2 and S3 from 15 mm to 50 mm. As a result, it was found that as the wiring length between the second and the third branch points S2 and S3 was increased, the position at which the rising waveform started to blunt was shifted backwards. It can be seen from this that the blunting in the rising waveform of the lower chip D13 is caused by the reflected waves produced after the third branch point S3.

Based on the findings as described above, in the first embodiment, as shown in FIG. 1, the wiring configuration is such that the relations of TL0≈TL1, TL0<TL3_1, and TL1<TL3_1 are established among the wiring lengths. The wiring length TL0 between the buffer element and the first branch point S1 is set to be substantially equal to the wiring length TL1 between the first and the second branch points S1 and S2, whereby in the signal waveform of the memory element 317R, the negative reflected waves from the second branch point S2 are canceled with the positive reflected waves obtained by the negative reflected waves from the first branch point S1 being reflected at the buffer element. The wiring length TL3_1 between the second and the third branch points S2 and S3 is set to be greater than TL0 or TL1 to delay the occurrence of blunting in the signal rising waveform of the memory element 313R so that the waveform is interfered with the positive reflected waves reflected at the buffer element. This makes it possible to cause the rising waveform to start blunting after the time point when the threshold voltage is exceeded and, at the same time, to reduce the effect of the blunting.

Figure 6:
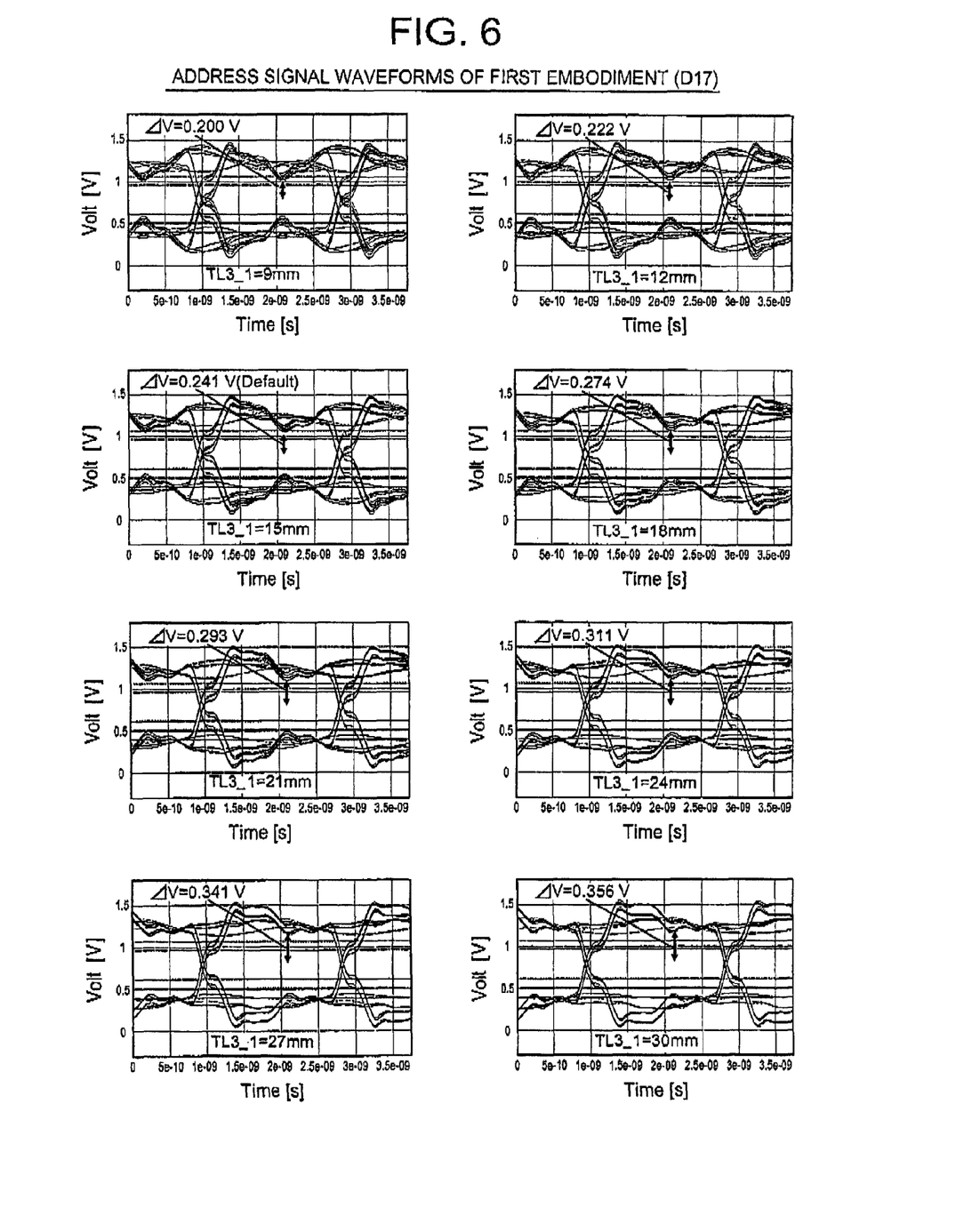
FIG. 6 shows address signal waveforms according to the first embodiment of the present invention.
Figure 7:
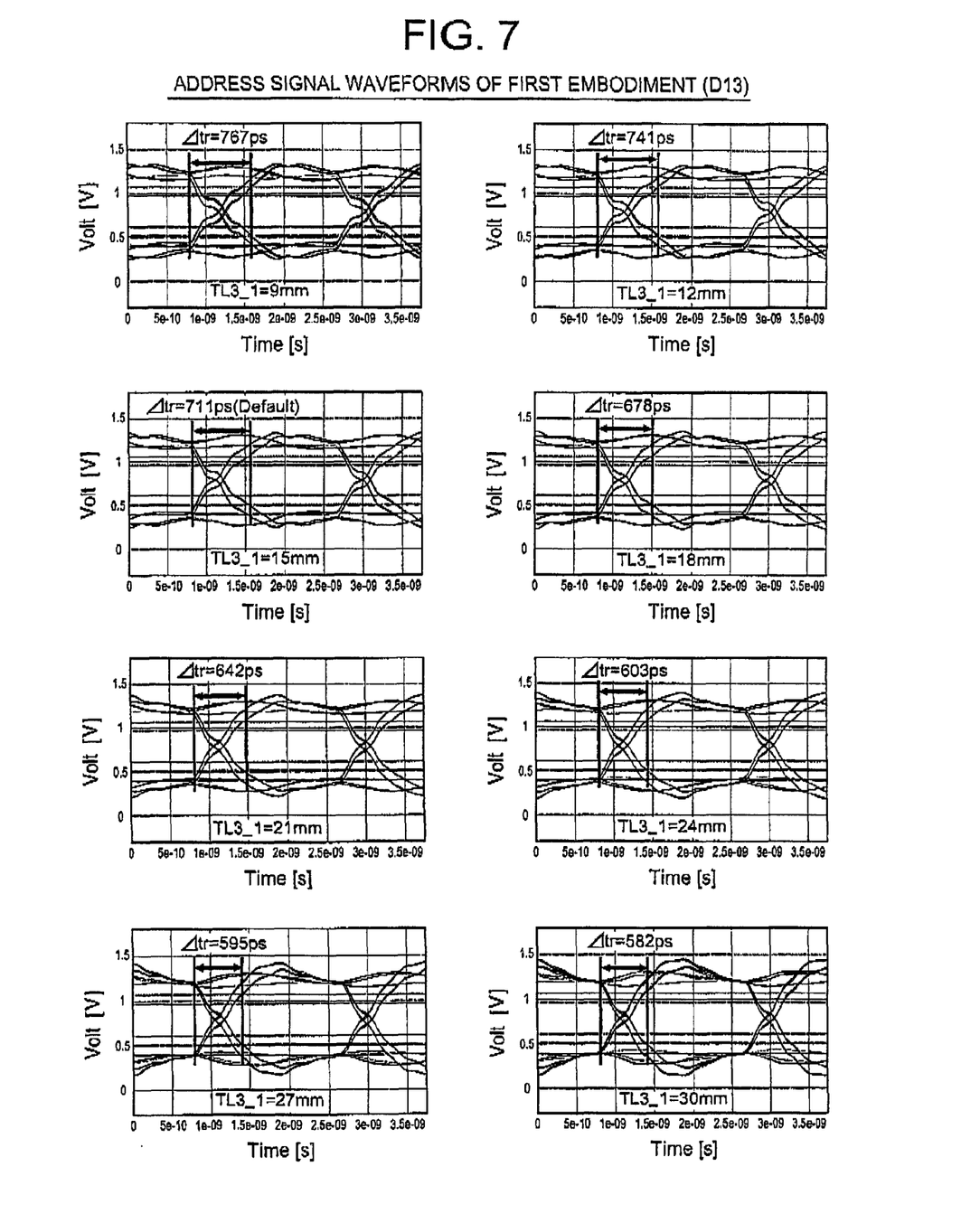
FIG. 7 shows address signal waveforms according to the first embodiment of the present invention.

FIG. 6 and FIG. 7 respectively show address signal waveforms of the lower chips D17 and D13 as observed when the wiring length TL3_1 is changed from 9 mm to 30 mm.

Figure 8:
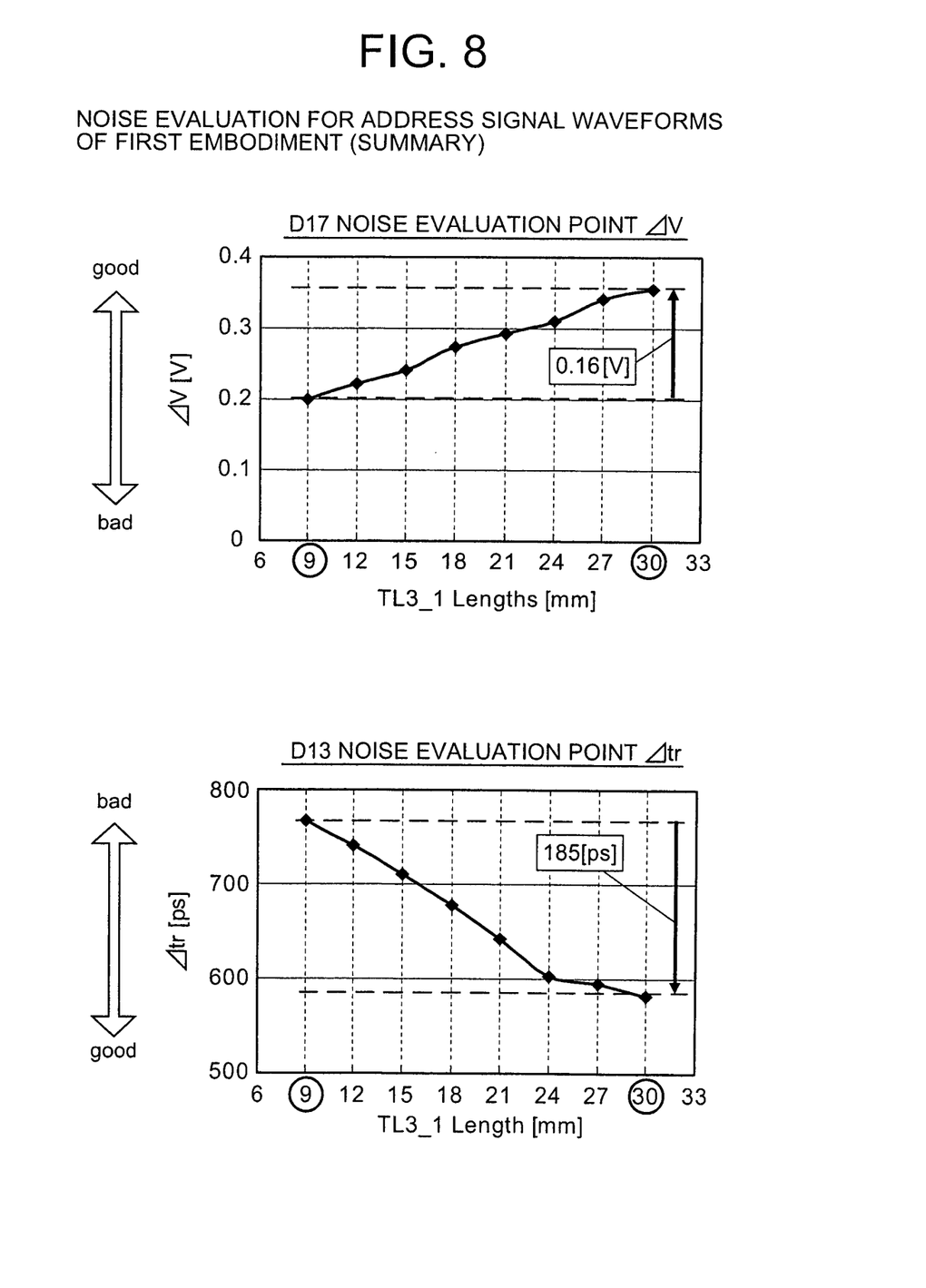
FIG. 8 is diagrams showing noise evaluation results of the address signal waveforms according to the first embodiment of the present invention.

FIG. 8 shows the results of noise evaluation based on the voltage ΔV at the pinched portion of the lower chip D17 (the upper diagram of FIG. 8) and the rising time Δtr of the lower chip D13 (the lower diagram of FIG. 8). It can be seen from these results that both the noise voltage ΔV of the lower chip D17 and the rising time Δtr of the lower chip D13 can be reduced if the wiring length TL3_1 is 30 mm. In the lower chip D13, the time required to propagate a signal over a distance corresponding to twice the wiring length (distance) TL3_1 from the second branch point S2 where the second branch line branches to the third branch point S3 where the third branch line branches is represented by $T_{2-3}$, and the rising time required for the address signal level to exceed a threshold voltage used for distinguishing the "0" level and the "1" level of the memory element connected to the branch point where the second branch line branches is represented by $\Delta t_2$. In this case, as clearly seen from FIG. 8, the delay time of the rising time Δtr can be reduced if the wiring length TL3_1 is set to 24 mm or greater so that the signal propagation time $T_{2-3}$ is longer than the rising time $\Delta t_2$.

As described above, the waveform distortion in the memory elements near the buffer element can be reduced by setting the wiring lengths in the wiring configuration shown in FIG. 1A to establish the relations of TL0≈TL1, TL0<TL3_1, and TL1<TL3_1.

Figure 9A:
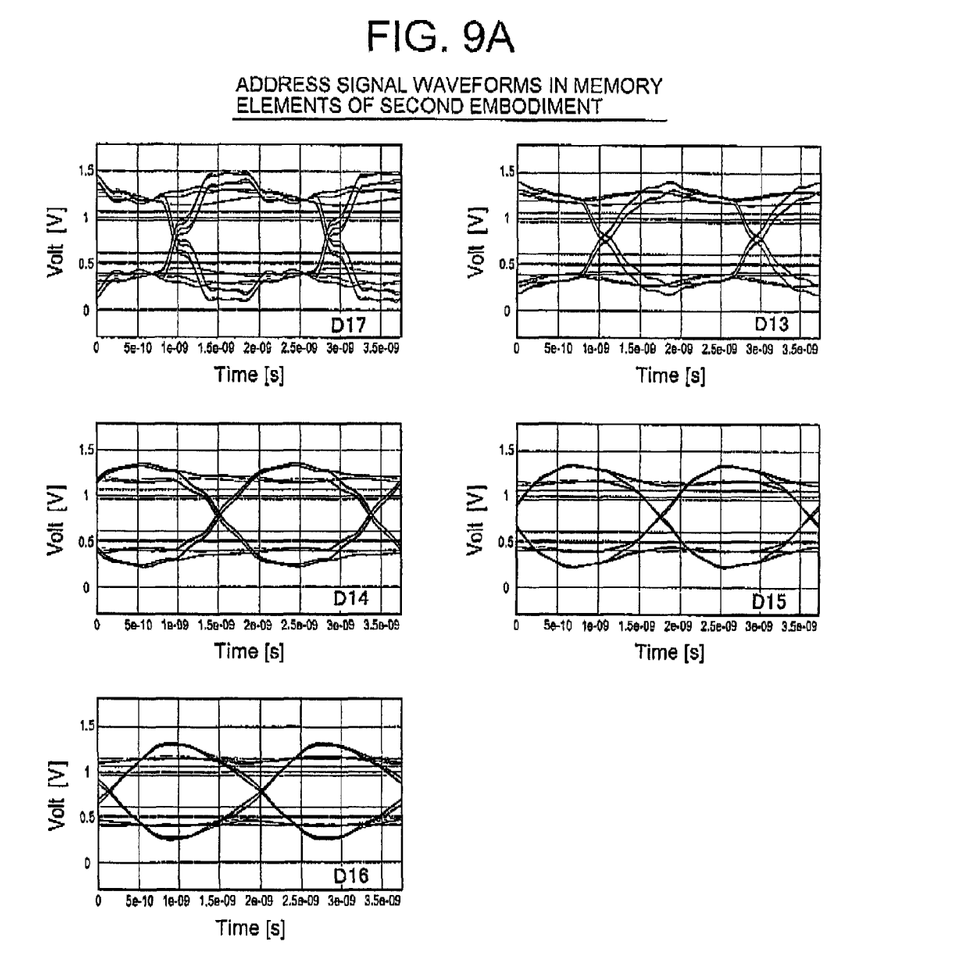
FIGS. 9A and 9B are diagrams showing address signal waveforms of memory elements in association with wiring lengths according to a second embodiment of the present invention, FIG. 9A showing the address signal waveforms and FIG. 9B showing the wiring lengths.
Figure 9B:
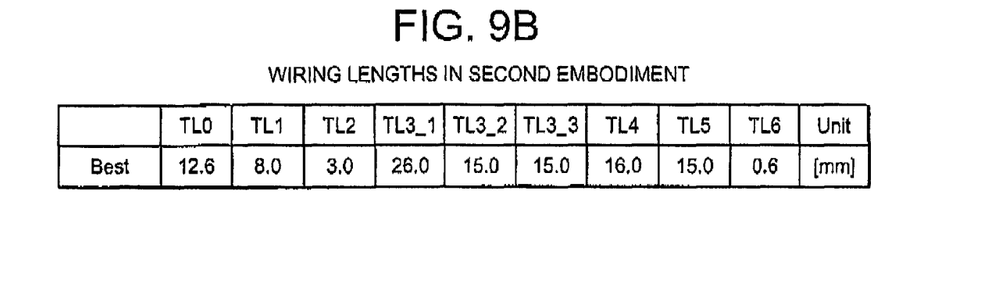

A second embodiment of the present invention will be described with reference to FIG. 1A and FIGS. 9A and 9B. In the second embodiment, the topology in FIG. 1A has a wiring configuration shown in FIG. 9B. In this wiring configuration, the wiring lengths are such that TL0>TL1, TL0<TL3_1, and TL1<TL3_1. As shown in FIG. 9A, this wiring configuration also can minimize the waveform distortion in the memory elements. In the second embodiment, the wiring length TL0 is set to be greater than the wiring length TL1, whereby the positive reflected waves obtained by reflecting reflected waves from the first branch point S1 at the buffer element reaches after reaching of the negative reflected waves from the second branch point S2. This makes it possible to correct the waveform with the positive reflected waves from the buffer element, immediately after the occurrence of waveform distortion at the second branch point S2, and thus to reduce the waveform distortion and delay due to noise.

Figure 10A:
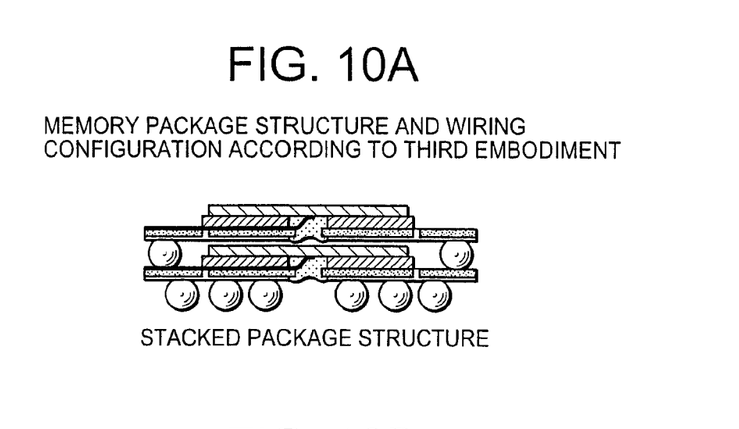
FIG. 10A shows a stacked package structure.

A third embodiment of the present invention will be described with reference to FIGS. 1A and 1B, FIGS. 10A to 10C, FIG. 11, and FIG. 12. In the third embodiment, as shown in FIG. 10A, a memory package is formed by stacking the memory elements while equally setting the wiring lengths in the package. In the third embodiment, like the first embodiment, the wiring pattern on the printed wiring board (memory board) is formed under the conditions shown in FIGS. 1A and 1B.

Figure 10B:
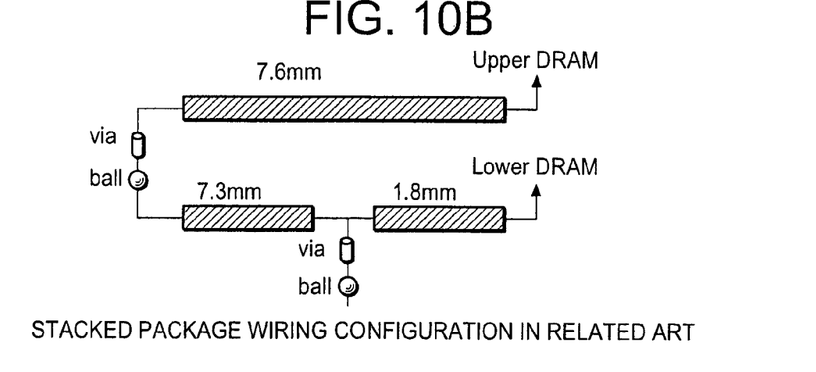
FIG. 10B is a diagram showing a stacked package wiring configuration according a related art example.
Figure 10C:
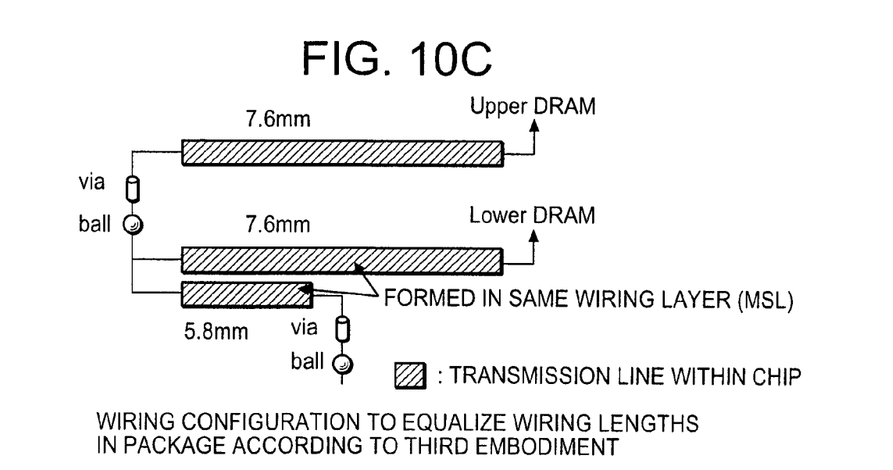
FIG. 10C is a diagram showing a package wiring configuration according to a third embodiment of the present invention.

In a stacked package of a related art, wiring is branched into an upper memory chip and a lower memory chip at a solder ball for electrically connecting the package to a printed wiring board. Therefore, as shown in FIG. 10B, the wiring length to the upper memory chip is different from that to the lower memory chip. In contrast, according to the third embodiment as shown in FIG. 10C, wiring from a solder ball for electrically connecting the package to a printed wiring board is branched in the vicinity of a solder ball for connecting an interposer for the upper chip and an interposer for the lower chip. The wiring length in the upper chip and the wiring length in the lower chip after the branching are substantially equal to each other.

Figure 11:
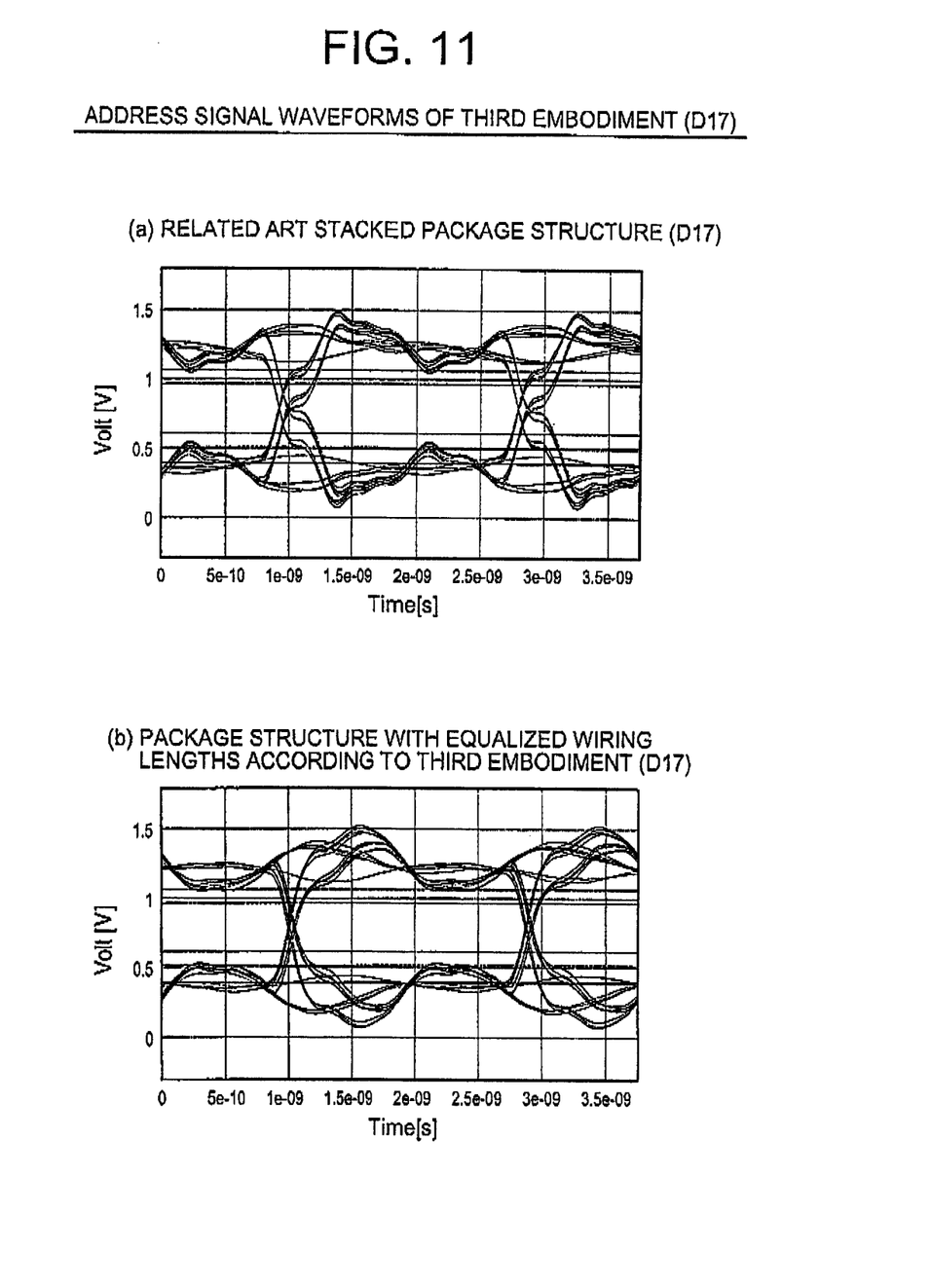
FIG. 11 shows address signal waveforms according to the third embodiment of the present invention.
Figure 12A:
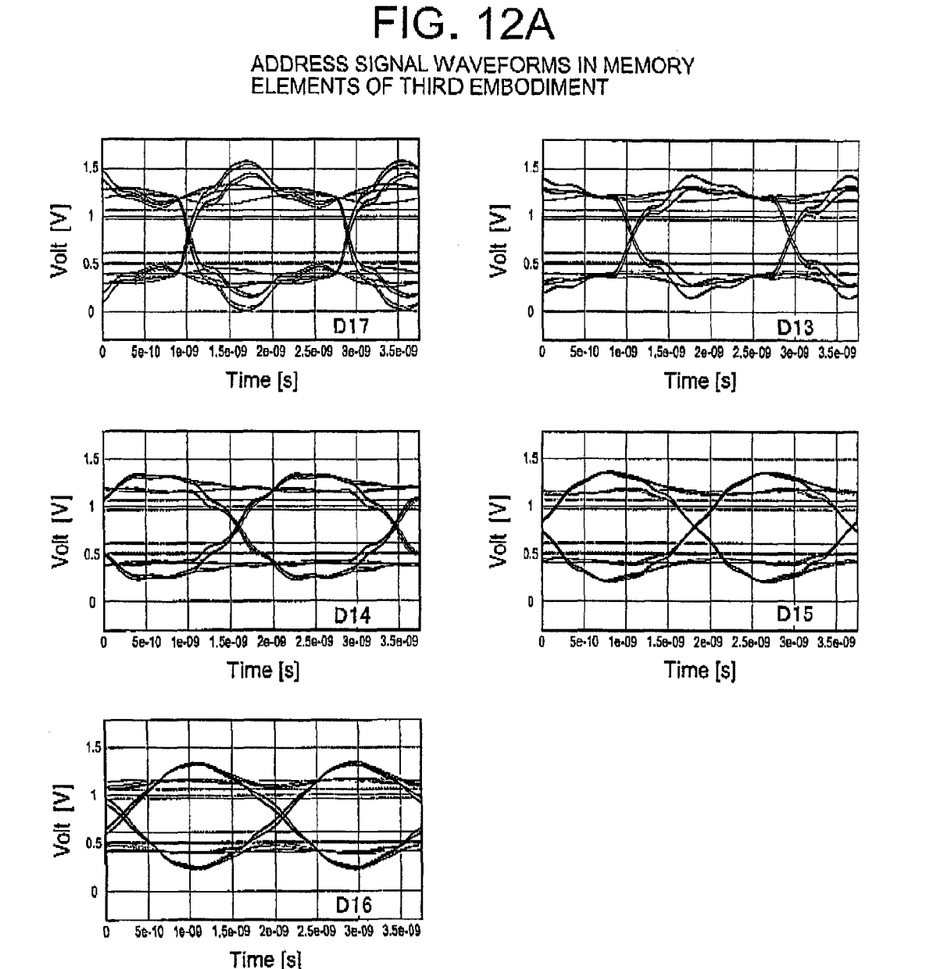
Figure 12B:
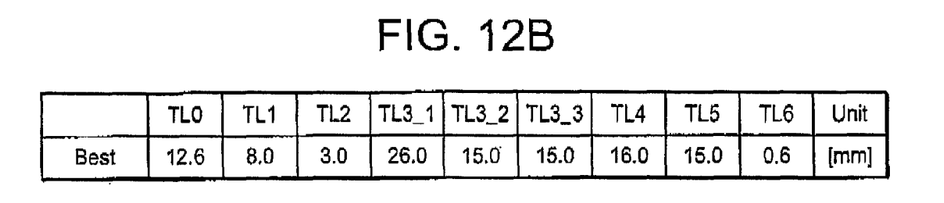
FIG. 12B shows wiring lengths according to the third embodiment of the present invention.

FIG. 11 and FIG. 12 show waveforms in the memory chip D17 according to the third embodiment. As shown in the lower diagram (b) of FIG. 11 and FIG. 12A, the step in the rising waveform in the memory chip D17 can be eliminated. This makes it possible not only to correct the waveform distortion due to reflection by the printed board but also to shape the waveform in the chip. Accordingly, a signal can be transmitted at a higher speed.

A fourth embodiment of the present invention will be described with reference to FIGS. 13 and 14. In the fourth embodiment, the memory board (memory DIMM board) 300 of the first embodiment (indicated by the reference number 1530 in FIG. 13) is mounted in a server device (information processing device) 1510.

Figure 13:
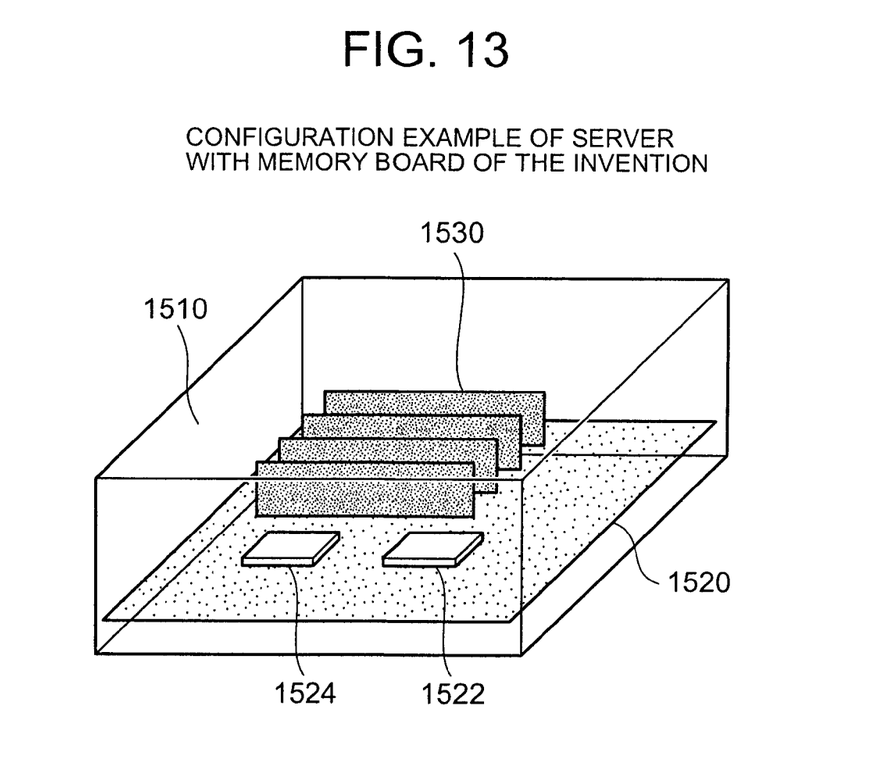
FIG. 13 is a diagram showing an example of configuration of a server device having a memory board according to a fourth embodiment of the present invention.

As shown in FIG. 13, the server device 1510 comprises a CPU board 1520 on which a CPU 1522 and a memory controller 1524 are mounted. The CPU board 1520 comprises a memory board 1530 according to the fourth embodiment mounted thereon.

Figure 14:
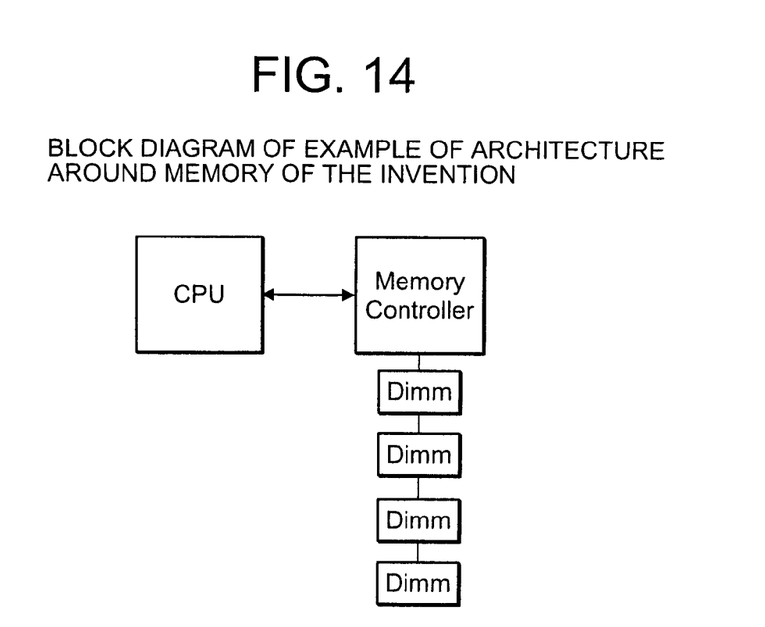
FIG. 14 is a block diagram showing architecture of elements of the memory according to the fourth embodiment of the present invention.

FIG. 14 is a block diagram showing architecture of elements of the memory of the server device according to the fourth embodiment.

The server device comprising the memory board of the present invention mounted thereon is allowed to be mounted with a large-capacity and high-speed memory and thus to improve the throughput performance of the system as a whole.

The present invention is generally applicable to semiconductor devices and printed wiring boards for mounting semiconductor devices.

While the present invention has been particularly shown and described with reference to exemplary embodiments thereof, the present invention is not limited to these embodiments. It will be understood by those of ordinary skill in the art that various changes in form and details may be made therein without departing from the sprit and scope of the present invention as defined by the claims.

What is claimed is:

1. An apparatus comprising:
   a wiring board; and
   first, second and third memory devices each mounted on the wiring board;
   the wiring board comprising:
      a main bus line including first, second and third nodes arranged such that a signal is transferred from the first node to the third node through the second node; and
      first, second and third sub bus lines branching respectively from the first, second and third nodes and electrically coupled respectively to the first, second and third memory devices;
      the first and second nodes defining a first line portion therebetween, and the second and third nodes defining a second line portion therebetween, the first line portion being greater in length than the second line portion,
   wherein each of the first and second line portions is free from an additional node from which an additional sub bus line branches,
   the wiring board further comprising a fourth memory device mounted on the wiring board, wherein the main bus line of the wiring board further includes a fourth node arranged adjacently to the third node such that the signal is transferred from the third node to the fourth node, the wiring board further comprising a fourth sub bus line branching from the fourth node and electrically coupled to the fourth memory device, the third and fourth nodes defining a third line portion therebetween, and the third line portion being substantially equal in length to the second line portion.

2. The apparatus according to claim 1, further comprising a terminating resistor, wherein the wiring board further comprises a fifth sub bus line further branching from the fourth node and electrically coupled to the terminating resistor.

3. An apparatus comprising:
   a wiring board; and
   first, second and third memory devices each mounted on the wiring board;
   the wiring board comprising:
      a main bus line including first, second and third nodes arranged such that a signal is transferred from the first node to the third node through the second node; and
      first, second and third sub bus lines branching respectively from the first, second and third nodes and electrically coupled respectively to the first, second and third memory devices;
      the first and second nodes defining a first line portion therebetween, and the second and third nodes defining a second line portion therebetween, the first line portion being greater in length than the second line portion,
   wherein the wiring board includes first and second surfaces opposed to each other and each of the first, second and third memory devices is mounted on the first surface of the wiring board,
   the wiring board further comprising a buffer element outputting the signal, the buffer element being mounted on the second surface of the wiring board.

4. The apparatus according to claim 3, further comprising fifth, sixth and seventh memory devices each mounted on the second surface of the wiring board, the wiring board further comprising fifth, sixth and seventh sub bus lines branching respectively from the first, second and third nodes and electrically coupled respectively to the fifth, sixth and seventh memory devices.

5. An apparatus comprising:
   a wiring board;
   a buffer element mounted on the wiring board and outputting a signal at an output node thereof; and
   first, second, third and fourth memory devices each mounted on the wiring board;
   the wiring board comprising:
      a main bus line whose one end is coupled to the output node of the buffer element to be supplied with the signal, including first, second, third, fourth and fifth nodes, the first node intervening between the one end and the second node, the second node intervening between the first and third nodes, the third node intervening between the second and fourth nodes, and the fourth node intervening between the third and fifth nodes; and
      first, second, third, fourth and fifth sub bus lines branching respectively from the first, second, third, fourth and fifth nodes, the second, third, fourth and fifth sub bus lines being electrically coupled respectively to the first, second, third and fourth memory devices;
      the first and second nodes defining a first line portion therebetween, the second and third nodes defining a second line portion therebetween, the third and fourth nodes defining a third line portion therebetween, the fourth and fifth nodes defining a fourth line portion therebetween, and the second line portion being greatest in length of the first, second, third and fourth line portions,
   wherein the third and fourth line portions are substantially equal in length to each other.

6. The apparatus according to claim 5, wherein each of the first, second, third and fourth line portions is free from an additional node from which an additional sub bus line branches.

7. The apparatus according to claim 5, further comprising a terminating resistor, wherein the wiring board further comprises a sixth sub bus line further branching from the fifth node and electrically coupled to the terminating resistor.

8. An apparatus comprising:
   a wiring board;

a buffer element mounted on the wiring board and outputting a signal at an output node thereof; and first, second, third and fourth memory devices each mounted on the wiring board;

the wiring board comprising:

a main bus line whose one end is coupled to the output node of the buffer element to be supplied with the signal, including first, second, third, fourth and fifth nodes, the first node intervening between the one end and the second node, the second node intervening between the first and third nodes, the third node intervening between the second and fourth nodes, and the fourth node intervening between the third and fifth nodes; and first, second, third, fourth and fifth sub bus lines branching respectively from the first, second, third, fourth and fifth nodes, the second, third, fourth and fifth sub bus lines being electrically coupled respectively to the first, second, third and fourth memory devices;

the first and second nodes defining a first line portion therebetween, the second and third nodes defining a second line portion therebetween, the third and fourth nodes defining a third line portion therebetween, the fourth and fifth nodes defining a fourth line portion therebetween, and the second line portion being greatest in length of the first, second, third and fourth line portions, wherein the wiring board includes first and second surfaces opposed to each other and each of the first, second, third and fourth memory devices is mounted on the first surface of the wiring board, wherein the buffer element is mounted on the second surface of the wiring board.

9. The apparatus according to claim 8, further comprising fifth, sixth, seventh and eighth memory devices each mounted on the second surface of the wiring board, the wiring board further comprising seventh, eighth, ninth and tenth sub bus lines branching respectively from the second, third, fourth and fifth nodes and electrically coupled respectively to the fifth, sixth, seventh and eighth memory devices.

10. An apparatus comprising:
a wiring board; and
first, second, third and fourth memory devices each mounted on the wiring board;
the wiring board comprising:

a main bus line including first, second, third and fourth nodes arranged such that the second node intervenes between the first and third nodes and the third node intervenes between the second and fourth nodes; and first, second, third and fourth sub bus lines branching respectively from the first, second, third and fourth nodes and electrically coupled respectively to the first, second, third and fourth memory devices;

the first and second nodes defining a first line portion therebetween, the second and third nodes defining a second line portion therebetween, and the third and fourth nodes defining a third line portion therebetween, the first line portion being greater in length than the second line portion, the second line portion being substantially equal in length to the third line portion.

11. The apparatus according to claim 10, each of the first, second and third line portions is free from an additional node from which an additional sub bus line branches.

12. The apparatus according to claim 10, wherein the wiring board includes first and second surfaces opposed to each other and each of the first, second, third and fourth memory devices is mounted on the first surface of the wiring board.

13. The apparatus according to claim 12, further comprising fifth, sixth, seventh and eighth memory devices each mounted on the second surface of the wiring board, the wiring board further comprising fifth, sixth, seventh and eighth sub bus lines branching respectively from the first, second, third and fourth nodes and electrically coupled respectively to the fifth, sixth, seventh and eighth memory devices.

14. The apparatus according to claim 13, further comprising a buffer element coupled to the first node, the buffer element being mounted on the first surface of the wiring board.

15. The apparatus according to claim 13, further comprising a buffer element coupled to the first node, the buffer element being mounted on the second surface of the wiring board.

16. The apparatus according to claim 10, further comprising a terminating resistor, wherein the wiring board further comprises a ninth sub bus line further branching from the fourth node and electrically coupled to the terminating resistor.

* * * * *